(12) United States Patent
Chen et al.

(10) Patent No.: US 12,396,158 B2
(45) Date of Patent: Aug. 19, 2025

(54) MEMORY DEVICE AND METHOD OF MANUFACTURING THE SAME

(71) Applicant: MemoRist Co., Ltd., Taipei (TW)

(72) Inventors: Chao-Yang Chen, Taipei (TW); Chih-Jen Huang, Taipei (TW)

(73) Assignee: MEMORIST CO., LTD., Taipei (TW)

( * ) Notice: Subject to any disclaimer, the term of this patent is extended or adjusted under 35 U.S.C. 154(b) by 560 days.

(21) Appl. No.: 17/975,683

(22) Filed: Oct. 28, 2022

(65) Prior Publication Data

US 2023/0143211 A1     May 11, 2023

(30) Foreign Application Priority Data

Nov. 8, 2021  (TW) .................................. 110141444

(51) Int. Cl.
*H10B 12/00* (2023.01)
*G11C 5/06* (2006.01)

(52) U.S. Cl.
CPC ........... *H10B 12/312* (2023.02); *G11C 5/063* (2013.01); *H10B 12/0335* (2023.02); *H10B 12/05* (2023.02)

(58) Field of Classification Search
CPC .. H10B 12/312; H10B 12/0335; H10B 12/05; H10B 61/22; H10B 63/30; H10B 63/80; H10B 51/30; G11C 5/063; H01L 21/76897; H01L 23/5386
See application file for complete search history.

(56) References Cited

U.S. PATENT DOCUMENTS

| 2013/0170291 | A1 | 7/2013 | Liu |
| 2016/0233333 | A1 | 8/2016 | Toh et al. |
| 2016/0254444 | A1 | 9/2016 | Tahmasebi et al. |
| 2016/0276408 | A1 | 9/2016 | Chang et al. |
| 2021/0407590 | A1* | 12/2021 | Van Dal ............. H10N 70/8833 |

FOREIGN PATENT DOCUMENTS

TW      I731773 B      6/2021

* cited by examiner

*Primary Examiner* — David Vu
(74) *Attorney, Agent, or Firm* — Li & Cai Intellectual Property (USA) Office

(57) ABSTRACT

A memory device and a method of manufacturing the same are provided. The memory device includes a substrate, a memory cell array, and a memory cell interconnection structure. The memory cell array is disposed on the substrate. Each memory cell in the memory cell array includes a transistor unit and a memory unit that are electrically connected to each other. The memory cell interconnection structure is configured to establish an electrical connection between the memory cells, and includes a dielectric layer and a plurality of drain conductive structures. At least one drain conductive pillar includes a first contact portion and a second contact portion that are connected to each other and embedded in the dielectric layer. One side surface of the first contact portion is recessed along a first direction with respect to one side surface of the second contact portion, so as to form a stepped structure.

10 Claims, 16 Drawing Sheets

MEMORY DEVICE AND METHOD OF MANUFACTURING THE SAME

CROSS-REFERENCE TO RELATED PATENT APPLICATION

This application claims the benefit of priority to Taiwan Patent Application No. 110141444, filed on Nov. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a memory device and a method of manufacturing the same, and more particularly to a random access memory device and a method of manufacturing the same.

BACKGROUND OF THE DISCLOSURE

Currently, a new generation of non-volatile memory components has been actively developed in the relevant industry. In order to increase the density of memory cells, the size of the memory cell needs to be reduced as much as possible. However, additional lines are required for establishing connections between the memory cells and between a resistive random access memory and a transistor. As a result, it is difficult to further reduce the size of the memory cell.

SUMMARY OF THE DISCLOSURE

In response to the above-referenced technical inadequacy, the present disclosure provides a memory device and a method of manufacturing the same, in which a connection structure between memory cells is so modified as to reduce the size of the memory cell.

In one aspect, the present disclosure provides a memory device, which includes a substrate, a memory cell array, and a memory cell interconnection structure. The memory cell array is disposed on the substrate and includes a plurality of memory cells. Each of the plurality of memory cells includes a transistor unit and a memory unit. The transistor unit includes a drain region, a gate structure, and a source region that are arranged along a first direction. The memory unit is electrically connected to the transistor unit. The memory cell interconnection structure is disposed on the substrate, and is configured to establish an electrical connection between the plurality of memory cells. The memory cell interconnection structure includes a dielectric layer and a plurality of drain conductive structures. The dielectric layer directly covers the substrate and the transistor units. Each of the plurality of drain conductive structures is electrically connected to a corresponding one of the memory units, and includes at least one drain conductive pillar. The at least one drain conductive pillar includes a first contact portion and a second contact portion that are connected to each other and are embedded in the dielectric layer. The first contact portion is physically connected to the drain region of a corresponding one of the transistor units, and one side surface of the first contact portion is recessed along the first direction with respect to one side surface of the second contact portion so as to form one stepped structure.

In another aspect, the present disclosure provides a method of manufacturing a memory device, which includes: forming a plurality of transistor units that are arranged in an array on a substrate, and forming a memory cell interconnection structure and a plurality of memory units. Each of the plurality of transistor units includes a drain region, a gate structure, and a source region that are arranged along a first direction, and the plurality of transistor units are arranged in a plurality of rows along a second direction. The plurality of memory units are respectively and electrically connected to the plurality of transistor units through the memory cell interconnection structure. The step of forming the memory cell interconnection structure at least includes: forming a dielectric layer and a plurality of drain conductive pillars on the substrate. Each of the plurality of drain conductive pillars includes a first contact portion and a second contact portion that are connected to each other and are embedded in the dielectric layer. The first contact portion is physically connected to the drain region of a corresponding one of the transistor units, and one side surface of the first contact portion is recessed along the first direction with respect to a side surface of the second contact portion so as to form a stepped structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
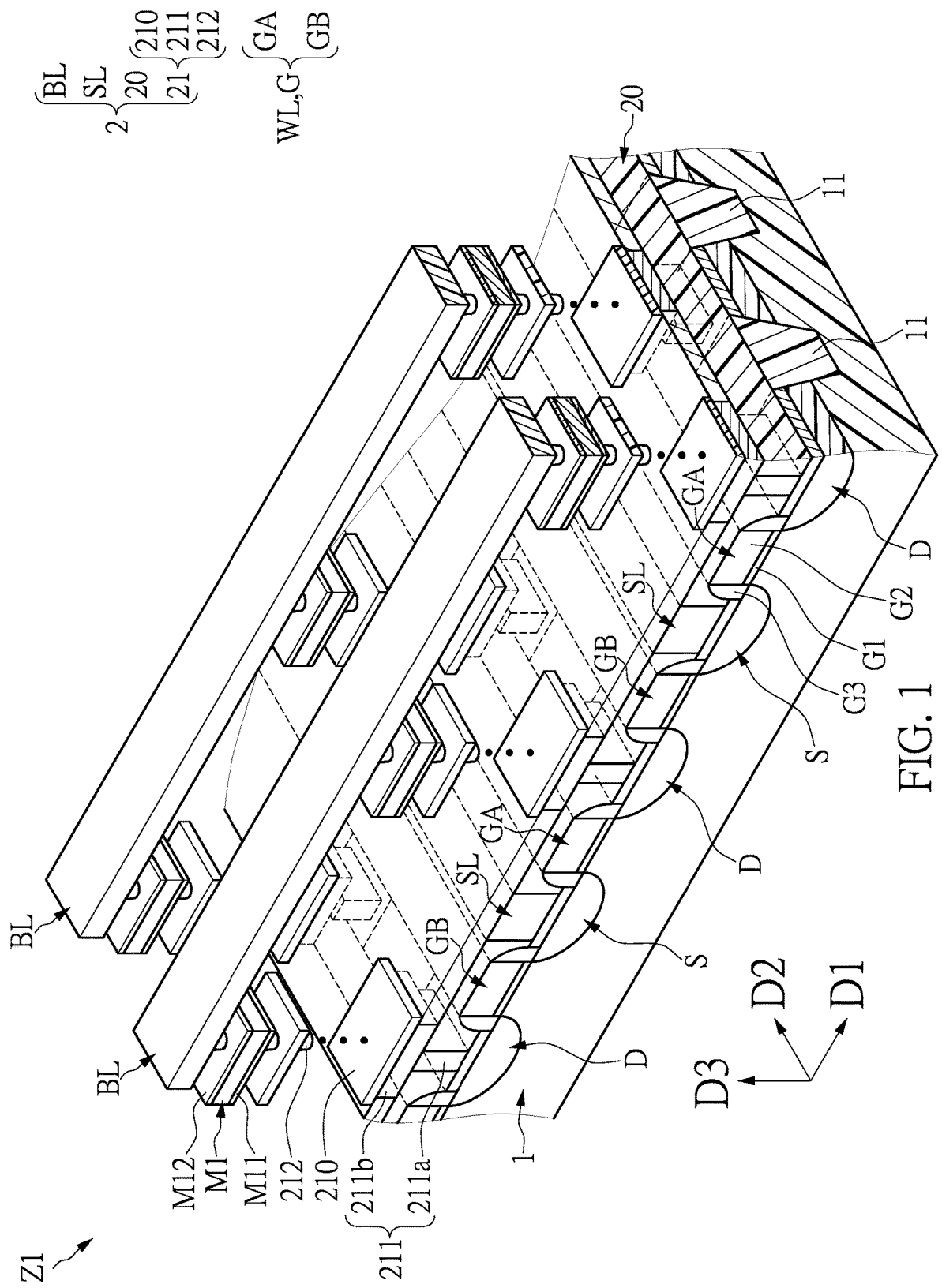
FIG. 1 is a partial schematic perspective view of a memory device according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiments

Figure 2:
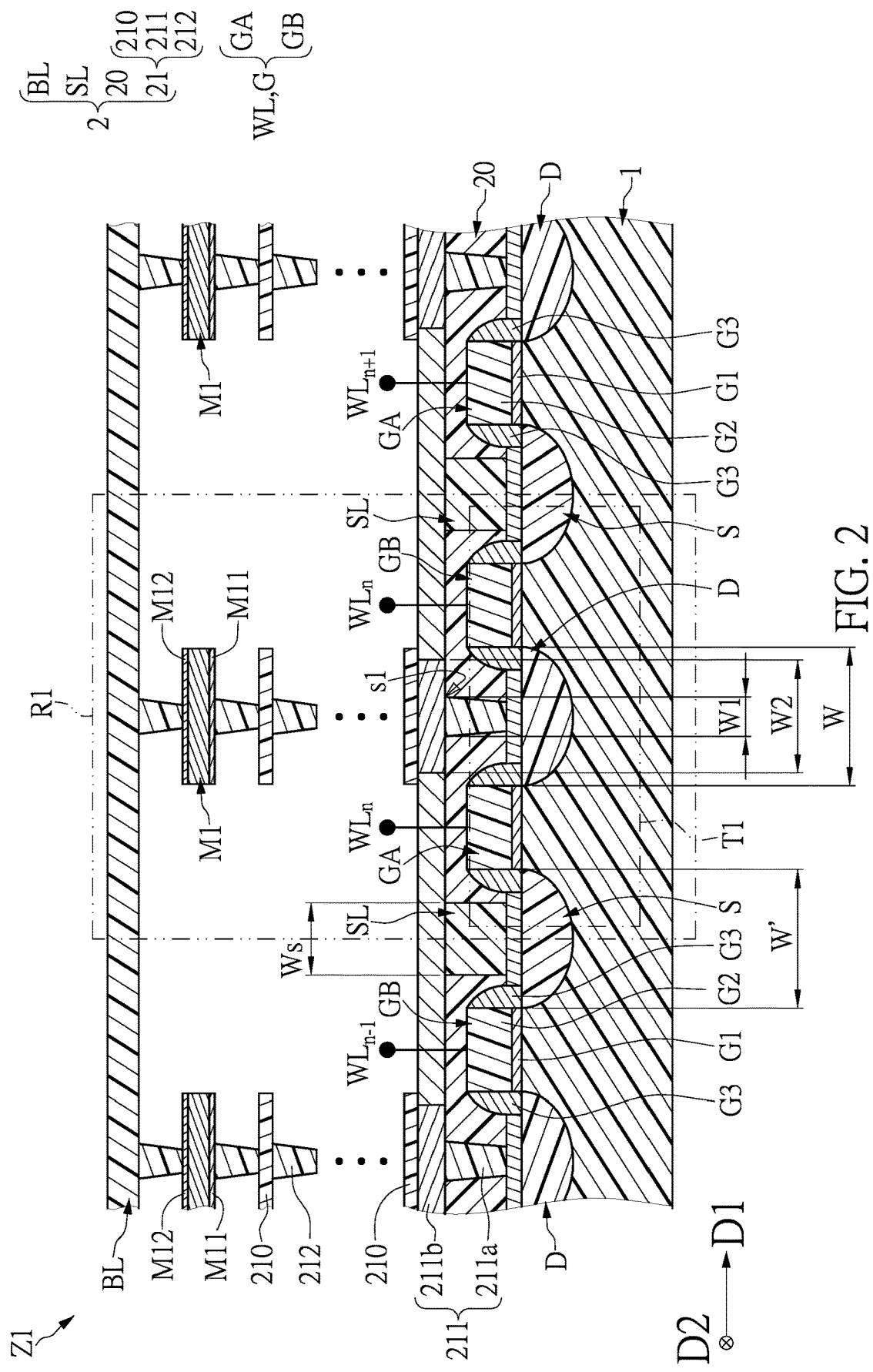
FIG. 2 is a partial cross-sectional view of the memory device according to one embodiment of the present disclosure.

Referring to FIG. 1 and FIG. 2, one embodiment of the present disclosure provides a memory device Z1. The memory device Z1 of the embodiment of the present disclosure includes a substrate 1, a memory cell array, and a memory cell interconnection structure 2.

The substrate 1 can be a semiconductor substrate or a semiconductor on insulator (SOI) substrate. Referring to FIG. 2, the memory cell array is disposed on the substrate 1, and includes a plurality of memory cells R1 (one memory cell R1 is exemplarily illustrated in FIG. 2). Each of the plurality of memory cells R1 includes a transistor unit T1 and a memory unit M1.

As shown in FIG. 1 and FIG. 2, the transistor units T1 are arranged in an array and disposed on the substrate 1, and each of the transistor units T1 includes a source region S, a drain region D, and a gate structure G. It should be noted that the transistor unit T1 of the embodiments of the present disclosure can be an N-type metal-oxide-semiconductor (NMOS) field effect transistor or a P-type metal-oxide-semiconductor (PMOS) field effect transistor, but the present disclosure is not limited thereto. As long as the transistor unit T1 is able to be operated with the memory unit M1, the type of the transistor unit T1 is not limited in the present disclosure.

Referring to FIG. 1 and FIG. 2, the source region S and the drain region D are correspondingly formed in the substrate 1 and are separate from each other, such that a channel region (not labeled in the figures) is defined therebetween. The gate structure G is disposed on the substrate 1 at a position that corresponds to the channel region. In the present embodiment, the substrate 1 also has a plurality of isolation structures 11, and each of the plurality of isolation structures 11 extends along a first direction D1, so as to separate two adjacent ones of the transistor units T1 that are arranged along a second direction D2. The isolation structure 11 extends downward from a surface of the substrate 1 to an interior of the substrate 1.

In the present embodiment, the gate structures G of the transistor units T1 that are arranged along the second direction D2 are connected to each other, so as to form a common gate line that extends along the second direction D2. The common gate line can serve as a word line WL. The gate structure G can include a gate insulation layer G1, a gate electrode G2, and two spacer portions G3. The gate insulation layer G1 is arranged between the gate electrode G2 and the substrate 1, and the two spacer portions G3 respectively cover opposite side surfaces of the gate electrode G2. Referring to FIG. 2, two gate structures G of two adjacent ones of the transistor units T1 are separately disposed on the substrate 1, and are respectively arranged on opposite sides of the source region S. The two gate structures G of the two adjacent transistor units T1 are regarded as two word lines (e.g., a word line $WL_{n-1}$ and a word line $WL_n$, or the word line $WL_n$ and a word line $WL_{n+1}$), respectively. That is, different operating signals can be provided to the gate electrodes G2 of the two gate structures G.

In the present embodiment, each of the gate structures G includes a first gate stack portion GA and a second gate stack portion GB. As shown in FIG. 1 and FIG. 2, the first gate stack portion GA and the second gate stack portion GB are spaced apart from each other, and are respectively arranged on opposite sides of the drain region D. Further, the first gate stack portion GA and the second gate stack portion GB overlap with two different ones of the channel region, respectively.

Each of the first gate stack portion GA and the second gate stack portion GB includes the gate insulation layer G1, the gate electrode G2, and the two spacer portions G3. It is worth mentioning that, as shown in FIG. 2, the gate electrode G2 of the first gate stack portion GA is electrically connected to the gate electrode G2 of the second gate stack portion GB for controlling whether or not to simultaneously generate inversion currents in the two channel regions respectively under the first gate stack portion GA and the second gate stack portion GB. Accordingly, the transistor unit T1 can be allowed to apply a higher operating current to the memory unit M1 that is electrically connected thereto, but the present disclosure is not limited thereto. In another embodiment, the gate structure G can also include only one gate stack portion, and the transistor unit T1 can still operate in conjunction with the memory unit M1.

In addition, the first gate stack portion GA and the second gate stack portion GB extend along the second direction D2, so as to form two common gate lines. Accordingly, the two common gate lines formed by the first gate stack portion GA and the second gate stack portion GB can be regarded as the same word line WL (e.g., the word line $WL_n$), so that a same operating signal is provided thereto.

Referring to FIG. 2, each of the memory units M1 can include a lower electrode M11 and an upper electrode M12. For each of the memory units M1, the memory unit M1 is electrically connected to the transistor unit T1. By controlling a switch of the transistor unit T1 and a bias voltage that is applied to the memory unit M1, a write-in state of the memory unit M1 (e.g., enabling the memory unit M1 to have a high resistance or a low resistance) can be modulated. Through reading a resistance value of the memory unit M1, the write-in state ("0" or "1") of the memory unit M1 can be obtained. For example, when the memory unit M1 has a high resistance value, the write-in state of the memory unit M1 is "0". When the memory unit M1 has a low resistance value, the write-in state of the memory unit M1 is "1". However, the present disclosure is not limited thereto.

Each of the memory units M1 can be, but is not limited to, a resistive random access memory (resistive RAM), a conductive bridging random access memory (conductive bridging RAM), a magnetoresistive random access memory (MRAM), a phase change random access memory (PCRAM), a ferroelectric random access memory (FeRAM), or any other type of memory that can work with the transistor unit T1.

As shown in FIG. 1 and FIG. 2, in the memory device Z1 of the embodiments of the present disclosure, the memory cell interconnection structure 2 is disposed on the substrate 1, and is configured to establish an electrical connection between the plurality of memory cells R1 of the memory cell array. The memory cell interconnection structure 2 of the present embodiment includes a dielectric layer 20 and a plurality of drain conductive structures 21.

The dielectric layer 20 is disposed on the substrate 1, and the dielectric layer 20 directly covers the substrate 1 and the transistor units T1. In the present embodiment, the dielectric layer 20 covers the gate structure G of each of the transistor units T1. Further, a top surface of the dielectric layer 20 is higher than a top end of the gate structure G. Each of the plurality of drain conductive structures 21 is connected between the lower electrode M11 of a corresponding one of the memory units M1 and the drain region D of a corresponding one of the transistor units T1. That is, the memory unit M1 of each of the plurality of memory cells R1 can be correspondingly and electrically connected to the transistor unit T1 through the drain conductive structure 21.

In the present embodiment, the drain conductive structure 21 includes one or more drain conductive layers 210 and one or more drain conductive pillars 211, 212. In the embodiment as shown in FIG. 1 and FIG. 2, each of the drain conductive structures 21 includes the multiple drain conductive layers 210 and the multiple drain conductive pillars 211, 212. At least one of the multiple drain conductive layers 210 is disposed on the dielectric layer 20. In addition, at least one of the multiple drain conductive pillars 211 extends downward from the top surface of the dielectric layer 20 to the substrate 1, and is physically connected to the drain region D of the transistor unit T1.

It should be noted that the drain conductive layers 210 and multiple insulation layers (not shown in the figures) may be alternately stacked with each other along a third direction D3. Two vertically adjacent drain conductive layers 210 of the drain conductive structure 21 are separated from each other by one insulation layer, and each of the drain conductive pillars 212 that are disposed on the dielectric layer 20 passes through a corresponding one of the insulation layers, so as to correspondingly connect the two vertically adjacent drain conductive layers 210. A quantity of the drain conductive layers 210 and a quantity of the drain conductive pillars 211, 212 can be adjusted according to practical requirements, which are not limited in the present disclosure.

As shown in FIG. 2, in the drain conductive structure 21 of the present embodiment, each of the drain conductive pillars 211 that are embedded in the dielectric layer 20 includes a first contact portion 211a and a second contact portion 211b that are connected to each other. The first contact portion 211a is physically connected to the drain region D of a corresponding one of the transistor units T1. The second contact portion 211b is connected between the first contact portion 211a and a corresponding one of the drain conductive layers 210. In the present embodiment, a width of the second contact portion 211b along the first direction D1 remains the same from top to bottom. However, in another embodiment, the width of the second contact portion 211b along the first direction D1 can also be gradually reduced from top to bottom.

In addition, a bottom surface of the second contact portion 211b of the present embodiment is directly connected to a top surface of the first contact portion 211a. It is worth mentioning that a maximum width W1 of the first contact portion 211a along the first direction D1 is less than a maximum width W2 of the bottom surface of the second contact portion 211b along the first direction D1. That is, the bottom surface of the second contact portion 211b partially overlaps with the first contact portion 211a. Accordingly, as shown in FIG. 2, one side surface of the first contact portion 211a is recessed along the first direction D1 with respect to one side surface of the second contact portion 211b so as to form a stepped structure S1.

In the present embodiment, a shortest distance W is defined between the gate electrode G2 of the first gate stack portion GA and the gate electrode G2 of the second gate stack portion GB of the gate structure G along the first direction D1. As shown in FIG. 2, the maximum width W1 of the first contact portion 211a along the first direction D1 is less than the shortest distance W between the gate electrode G2 of the first gate stack portion GA and the gate electrode G2 of the second gate stack portion GB.

It should be noted that a width between conventional conductive pillars is usually less than a distance between two adjacent gate electrodes, so that the conductive pillar may not easily come in contact with the gate electrode due to misalignment during formation of the conductive pillars. However, when the distance between the gate electrodes is shortened for reducing the size of the memory cell, the size of the conductive pillar (e.g., a cross-sectional area) is also reduced, thereby resulting in a high resistance of the conductive pillar.

In the embodiments of the present disclosure, under a circumstance where manufacturing requirements are met, a pitch between the first gate stack portion GA and the second gate stack portion GB can be further reduced when the first contact portion 211a of the drain conductive pillar 21 embedded in the dielectric layer 20 is configured to have a smaller width, thereby reducing the size of the memory cell R1. In addition, the maximum width W2 of the bottom surface of the second contact portion 211b along the first direction D1 is greater than or equal to the maximum width W1 of the first contact portion 211a along the first direction D1. That is, a part of the second contact portion 211b protrudes from the side surface of the first contact portion 211a along the first direction D1. In this way, the drain conductive pillar 211 may still have a low resistance, and a contact resistance between the drain conductive pillar 211 and the drain conductive layer 210 can be reduced.

It is worth mentioning that the maximum width W2 of the second contact portion 211b along the first direction D1 is not necessarily less than the shortest distance W between the gate electrode G2 of the first gate stack portion GA and the gate electrode G2 of the second gate stack portion GB. In one particular embodiment, the maximum width W2 of the second contact portion 211b along the first direction D1 can also be greater than or equal to the shortest distance W between the gate electrode G2 of the first gate stack portion GA and the gate electrode G2 of the second gate stack portion GB.

In the embodiments of the present disclosure, a top end of the first contact portion 211a is higher than the top end of the gate structure G. Therefore, even if the maximum width W2 of the second contact portion 211b is greater than or equal to the shortest distance W between the gate electrode G2 of the first gate stack portion GA and the gate electrode G2 of the second gate stack portion GB, the second contact portion 211b does not come in contact with gate electrode G2 of the gate structure G during formation of the drain conductive pillars 211. In this way, the drain conductive pillar 211 can be prevented from contacting the gate structure G due to misalignment. The detailed steps of manufacturing the memory device Z1 and effects achieved thereby will be provided in the following description, and thus are not elaborated herein.

With reference to FIG. 1 and FIG. 2, one drain conductive layer 210 is disposed on the dielectric layer 20, and is connected to the second contact portion 211b of the drain conductive pillar 211. In addition, an area of the drain conductive layer 210 is greater than a cross-sectional area of the second contact portion 211b along a horizontal direction (i.e., the first direction D1 or the second direction D2). As shown in FIG. 2, in an exemplary embodiment, a vertical projection of the drain conductive layer 210 completely overlaps with the second contact portion 211b, so that the drain conductive layer 210 and the drain conductive pillar 211 may have a lower contact resistance therebetween, but the present disclosure is not limited thereto.

Referring to FIG. 1, the memory cell interconnection structure of the embodiments of the present disclosure further includes a plurality of source lines SL that are disposed on the substrate 1. It is worth mentioning that, instead of being arranged above the dielectric layer 20, the plurality of source lines SL of the embodiments of the present disclosure and the gate structure G of the transistor unit T1 are jointly embedded in the dielectric layer 20. Further, each of the plurality of source lines SL comes in direct contact with the source region S of a corresponding one of the transistor units T1. In other words, in the embodiments of the present disclosure, each of the plurality of source lines SL is not electrically connected to the source region S of the transistor unit T1 through any conductive plug, but is directly formed on the substrate 1.

Accordingly, in the embodiments of the present disclosure, each of the plurality of source lines SL extends along the second direction D2, so that the source regions S of the transistor units T1 in a same row are electrically connected to each other through the source line SL. As shown in FIG. 2, a top surface of each of the plurality of source lines SL is higher than the top end of the gate structure G. In addition, for the two gate structures G (e.g., the word line $WL_{n-1}$ and the word line $WL_n$) of two adjacent ones of the transistor units T1, a shortest distance W' is defined between the gate electrode G2 of the first gate stack portion GA of one of the two gate structures G and the gate electrode G2 of the second gate stack portion GB of another one of the two gate structures G along the first direction D1. A maximum width Ws of each of the plurality of source lines SL along the first direction D1 is less than the shortest distance W'.

Furthermore, since an extension direction of each of the plurality of source lines SL (i.e. the second direction D2) is different from an extension direction of each of the plurality of isolation structures 11 (i.e., the first direction D1), each of the plurality of source lines SL intersects with each of the plurality of isolation structures 11.

In the embodiments of the present disclosure, the plurality of source lines SL that are embedded in the dielectric layer 20 still pass through an electrically conductive structure arranged above the dielectric layer 20, and are electrically connected to an external control circuit. However, compared to the conventional technology, the conductive plug between the source line SL and the source region S is omitted in the embodiments of the present disclosure, so that a quantity of the conductive plugs disposed in the dielectric layer 20 can be significantly reduced. In this way, a space required for placement of the conductive plugs can be saved. In addition, since the plurality of source lines SL and the gate structure G are co-located on the substrate 1, a space above the dielectric layer 20 that is reserved for wiring of the source lines SL is not required.

According to the above, under a circumstance where manufacturing requirements are met, an overall size of the plurality of memory cells R1 can be reduced. More specifically, for two of the transistor units T1 that are arranged along the first direction D1 and adjacent to each other (as shown in FIG. 2), a distance between the two adjacent gate structures G can be further reduced, thereby allowing the plurality of memory cells R1 to have a smaller size.

Referring to FIG. 1 and FIG. 2, the memory cell interconnection structure 2 further includes a plurality of bit lines BL. The plurality of bit lines BL extend along the first direction D1, and each of the plurality of bit lines BL is electrically connected to a corresponding one of the memory units M1. More specifically, each of the plurality of bit lines BL is electrically connected to the upper electrode M12 of the corresponding one of the memory units M1. It should be noted that, in the present embodiment, an extension direction of each of the plurality of bit lines BL is not parallel to the extension direction of each of the plurality of source lines SL.

The plurality of bit lines BL, the plurality of source lines SL, and the plurality of word lines WL are correspondingly and electrically connected to the external control circuit (not shown in the figures). Further, the external control circuit provides a control signal to the selected word line WL, the selected bit line BL, and the selected source line SL, so that a property (e.g., the resistance value) of the selected memory unit M1 of the memory cell R1 can be modulated for writing data.

Figure 3:
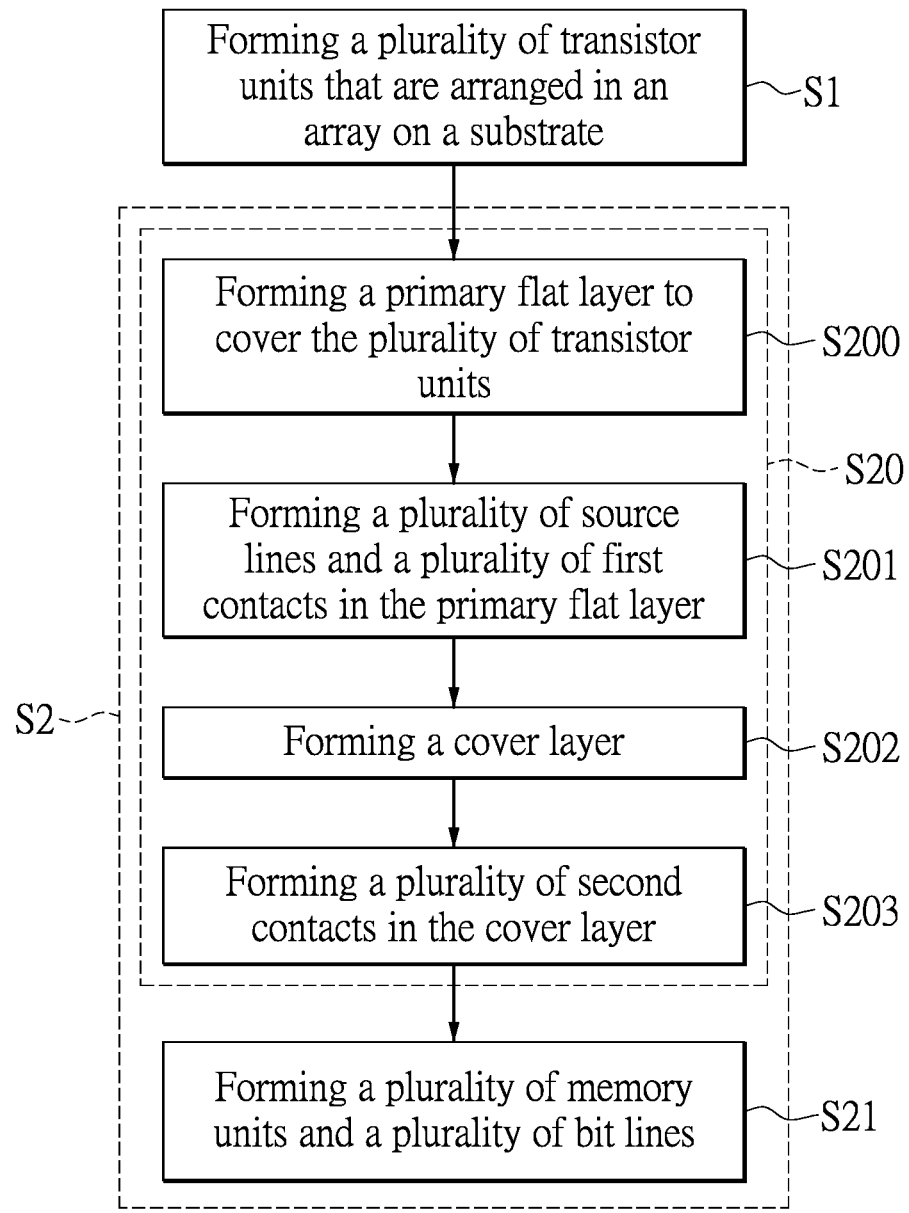
FIG. 3 is a flowchart of a method of manufacturing the memory device according to one embodiment of the present disclosure.
Figure 4:
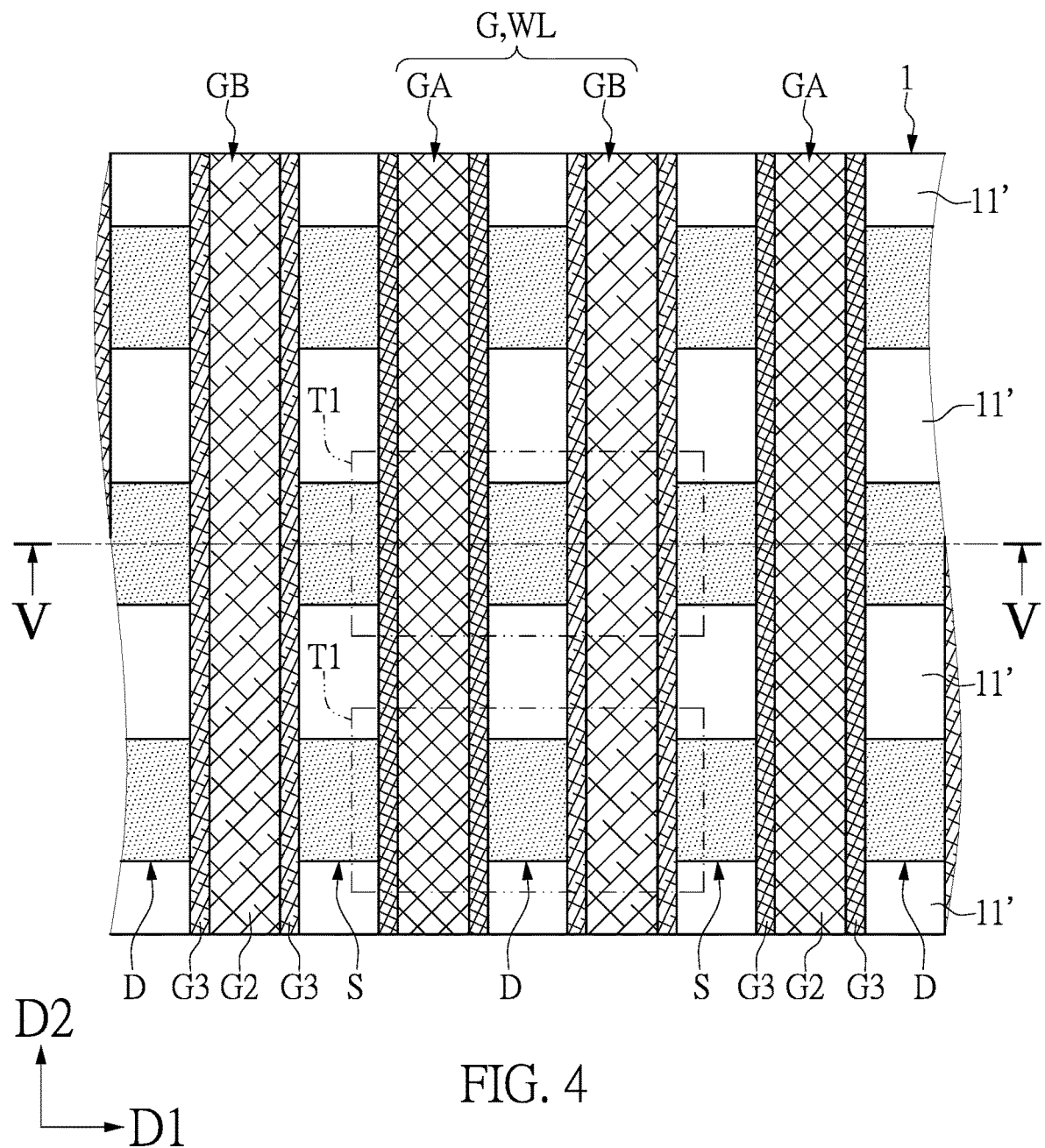
FIG. 4 is a schematic top view of the memory device during step S1 of the method according to one embodiment of the present disclosure.

Referring to FIG. 3, a flowchart of a method of manufacturing the memory device according to one embodiment of the present disclosure is shown. In step S1, a plurality of transistor units are formed in an array on a substrate. With reference to FIG. 4, a plurality of transistor units T1 are arranged in a plurality of rows along a second direction D2. Each of the plurality of transistor units T1 includes a drain region D, a gate structure G, and a source region S that are arranged along a first direction D1.

Figure 5:
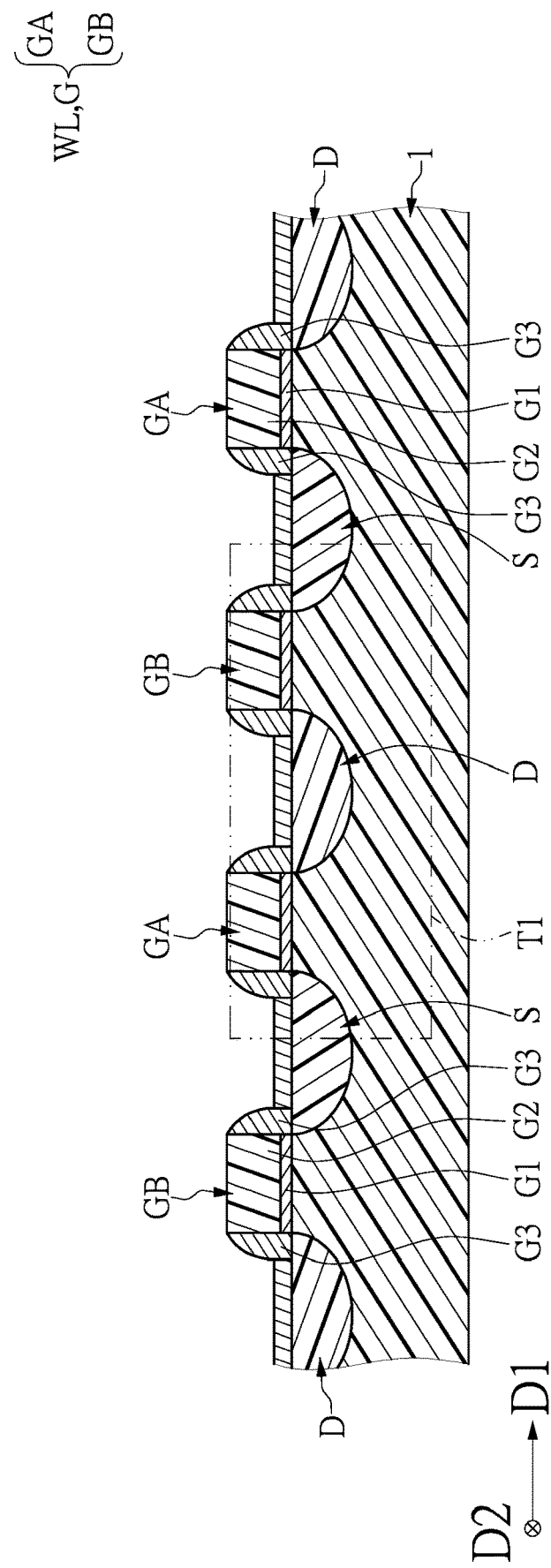
FIG. 5 is a schematic cross-sectional view taken along line V-V of FIG. 4.

As shown in FIG. 4 and FIG. 5, the multiple drain regions D and the multiple source regions S that are formed in the substrate 1 are alternately arranged along the first direction D1, so as to define multiple channel regions. The multiple gate structures G are disposed on the substrate 1 at positions that correspond to the multiple channel regions. In one particular embodiment (as shown in FIG. 5), a metallic silicide layer (not labeled in the figures) can be pre-formed on the source region S and the drain region D.

As shown in FIG. 4, the gate structures G of the transistor units T1 in the same row are connected to each other, so as to form a common gate line that extends along the second direction D2. The common gate line can serve as a word line WL. In the present embodiment, each of the gate structures G can include a first gate stack portion GA and a second gate stack portion GB that are spaced apart from each other, and the first gate stack portion GA and the second gate stack portion GB are respectively arranged on opposite sides of the drain region D, but the present is not limited thereto. The detailed structures of the first gate stack portion GA and the second gate stack portion GB are described above, and will not be reiterated herein.

In addition, the step of forming the plurality of transistor units T1 in the array further includes: forming a plurality of isolation structures 11' in the substrate 1. As shown in FIG. 4, the plurality of isolation structures 11' extend along the first direction D1, so as to separate two adjacent ones of the transistor units T1 that are arranged along the second direction D2. Since an extension direction of the plurality of isolation structures 11' is different from an extension direction of the common gate lines, each of the common gate lines partially overlaps with the plurality of isolation structures 11'.

Referring to FIG. 3, a memory cell interconnection structure and a plurality of memory units are formed in step S2. As described above, the plurality of memory units are respectively and electrically connected to the plurality of transistor units T1 through the memory cell interconnection structure. Further, the step of forming the memory cell interconnection structure and the plurality of memory units at least includes the following step.

Step S20 is to form a dielectric layer on the substrate, and a plurality of source lines and a plurality of drain conductive pillars that are embedded in the dielectric layer.

The step of forming the dielectric layer, the plurality of source lines, and the plurality of drain conductive pillars is further described below, but the present disclosure is not limited thereto. Referring to step S200 in FIG. 3, which is to be read in conjunction with FIG. 6 and FIG. 7, a primary flat layer 20a is formed to cover the plurality of transistor units T1. A top surface of the primary flat layer 20a is a flat surface. A material of the primary flat layer 20a can be oxide, nitride, or nitrogen oxide, but the present disclosure is not limited thereto. In addition, as shown in FIG. 7, a height of the top surface of the primary flat layer 20a relative to a surface of the substrate 1 is higher than a height of a top end of the gate structure G relative to the surface of the substrate 1. That is, the primary flat layer 20a completely covers the multiple gate structures G.

Next, in step S201 (as shown in FIG. 3), a plurality of source lines SL and a plurality of first contact portions 211a are formed in the primary flat layer 20a. The detailed step of forming the plurality of source lines SL and the plurality of first contact portions 211a is further described below. It should be noted that, in the present embodiment, the plurality of source lines SL and the plurality of first contact portions 211a are formed simultaneously, but the present disclosure is not limited thereto.

Figure 6:
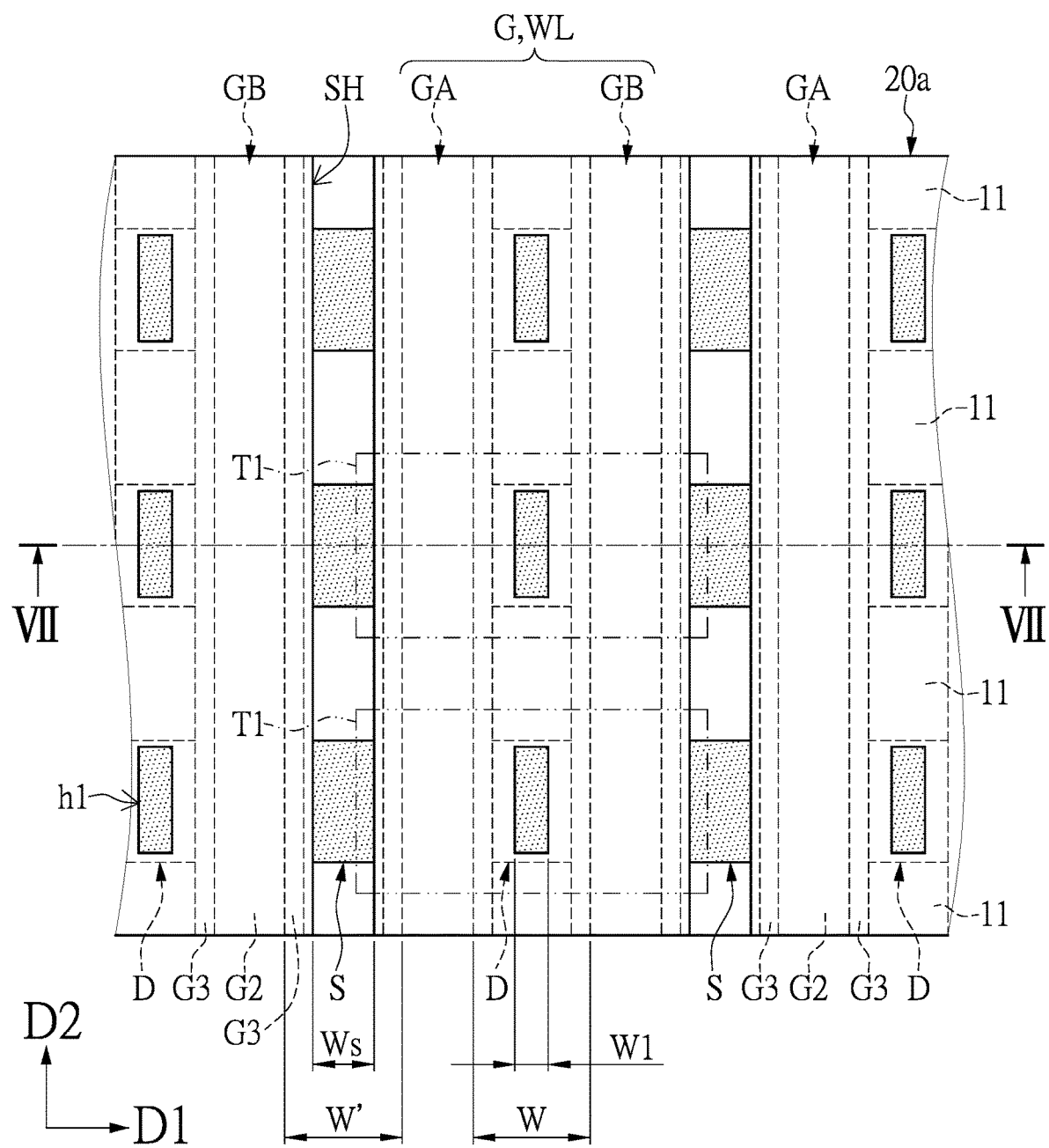
FIG. 6 is a schematic top view of the memory device during a step of forming a plurality of source grooves according to one embodiment of the present disclosure.
Figure 7:
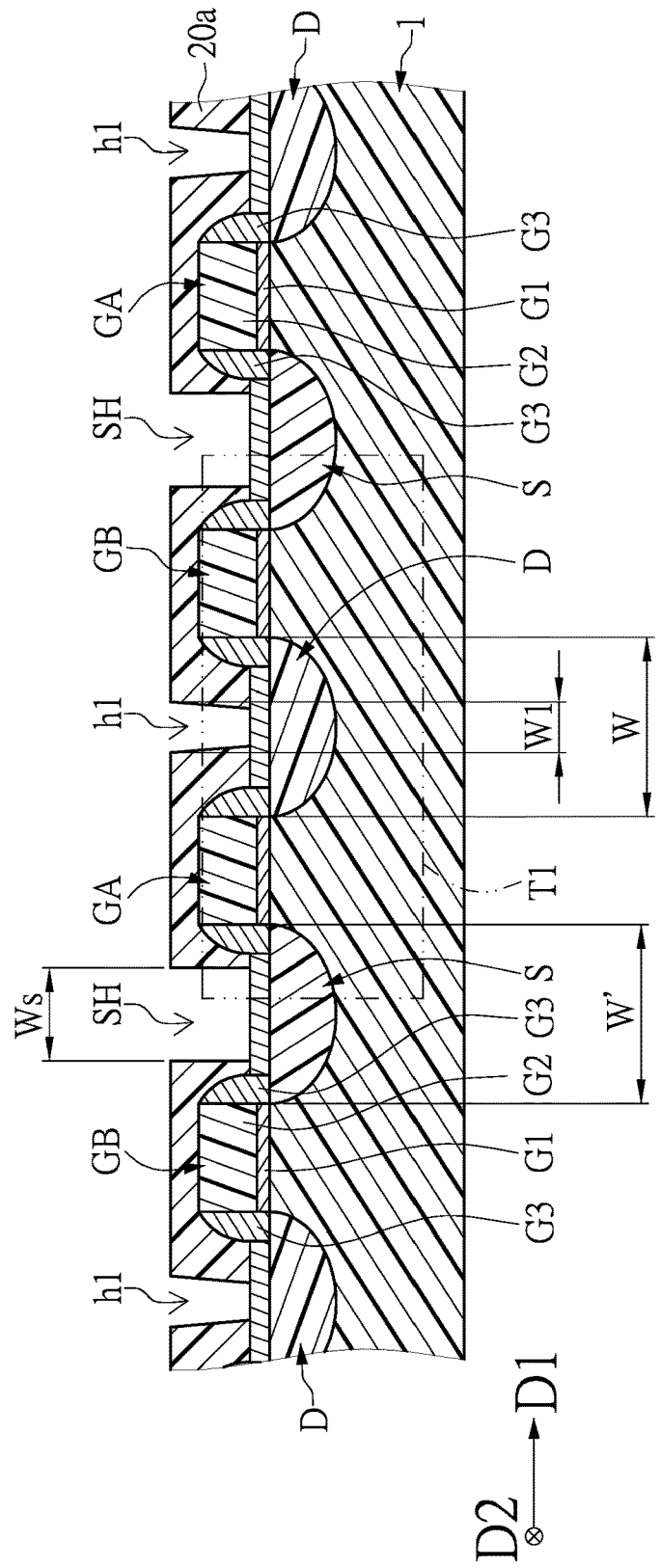
FIG. 7 is a schematic cross-sectional view taken along line VII-VII of FIG. 6.

Referring to FIG. 6 and FIG. 7, in one particular embodiment, a plurality of source grooves SH and a plurality of first contact holes h1 can be formed in the primary flat layer 20a by a photolithography etching process. As shown in FIG. 6 and FIG. 7, each of the plurality of source grooves SH extends along the second direction D2, so as to expose the source regions S of the transistor units T1 in a corresponding one of the rows. It should be noted that in the step of forming the plurality of source grooves SH, an isolation structure 11 under each of the plurality of source grooves SH is also etched, so as to form a recess (not show in the figures). In addition, positions of the plurality of first contact holes h1 correspond to the drain regions D, so as to expose the drain regions D of the transistor units T1.

As shown in FIG. 6 and FIG. 7, a shortest distance W is defined between a gate electrode G2 of the first gate stack portion GA and a gate electrode G2 of the second gate stack portion GB of the gate structure G. In the present embodiment, a maximum width W1 of the first contact hole h1 along the first direction D1 is less than the shortest distance W between the two gate electrodes G2 of the first gate stack portion GA and the second gate stack portion GB that are respectively arranged on opposite sides of the drain region D. Further, for the two gate structures G of two adjacent ones of the transistor units T1, a shortest distance W' is defined between the gate electrode G2 of the first gate stack portion GA of one of the two gate structures G and the gate electrode G2 of the second gate stack portion GB of another one of the two gate structures. Similarly, a maximum width Ws of each of the plurality of source grooves SH along the first direction D1 is less than the shortest distance W' between the two gate electrodes G2 of the first gate stack portion GA and the second gate stack portion GB that are respectively arranged on opposite sides of the source region S.

In this way, the gate electrode G2 of the first gate stack portion GA or the electrode G2 of the second gate stack portion GB can be prevented from being exposed by the first contact hole h1 or the source groove SH. Therefore, it is possible for the source line SL or the first contact portion 211a that is formed in the subsequent step to avoid contacting the gate electrode G2.

It should be noted that, since the shortest distance W between the two gate electrodes G2 of the first gate stack portion GA and the second gate stack portion GB that are respectively arranged on the opposite sides of the drain region D is not necessarily the same as the shortest distance W' between the two gate electrodes G2 of the first gate stack portion GA and the second gate stack portion GB that are respectively arranged on the opposite sides of the source region S, the maximum width Ws of each of the plurality of source grooves SH along the first direction D1 is not necessarily the same as the maximum width W1 of the first contact hole h1 along the first direction D1.

Figure 8:
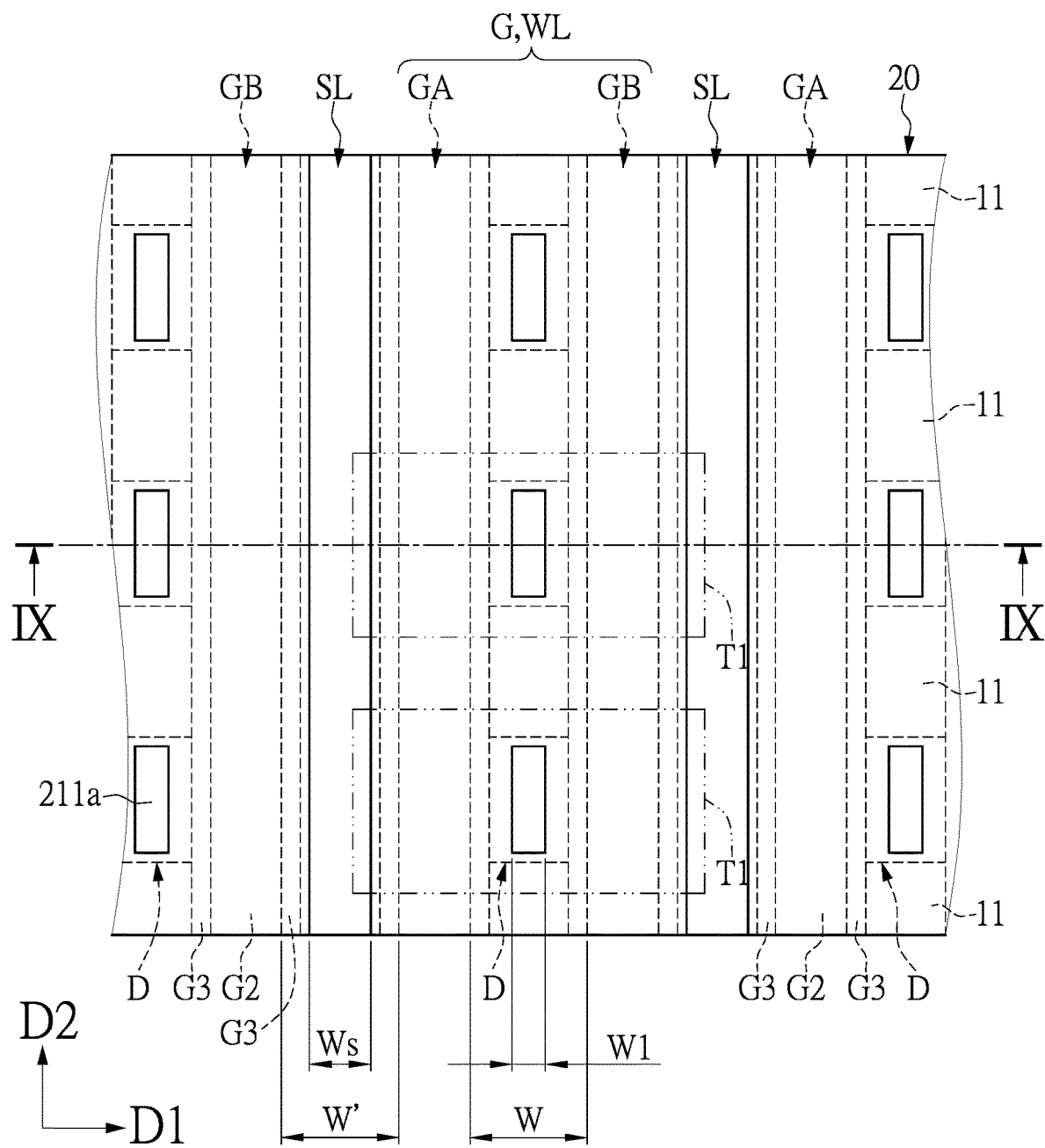
FIG. 8 is a schematic top view of the memory device during a step of forming a plurality of source lines according to one embodiment of the present disclosure.
Figure 9:
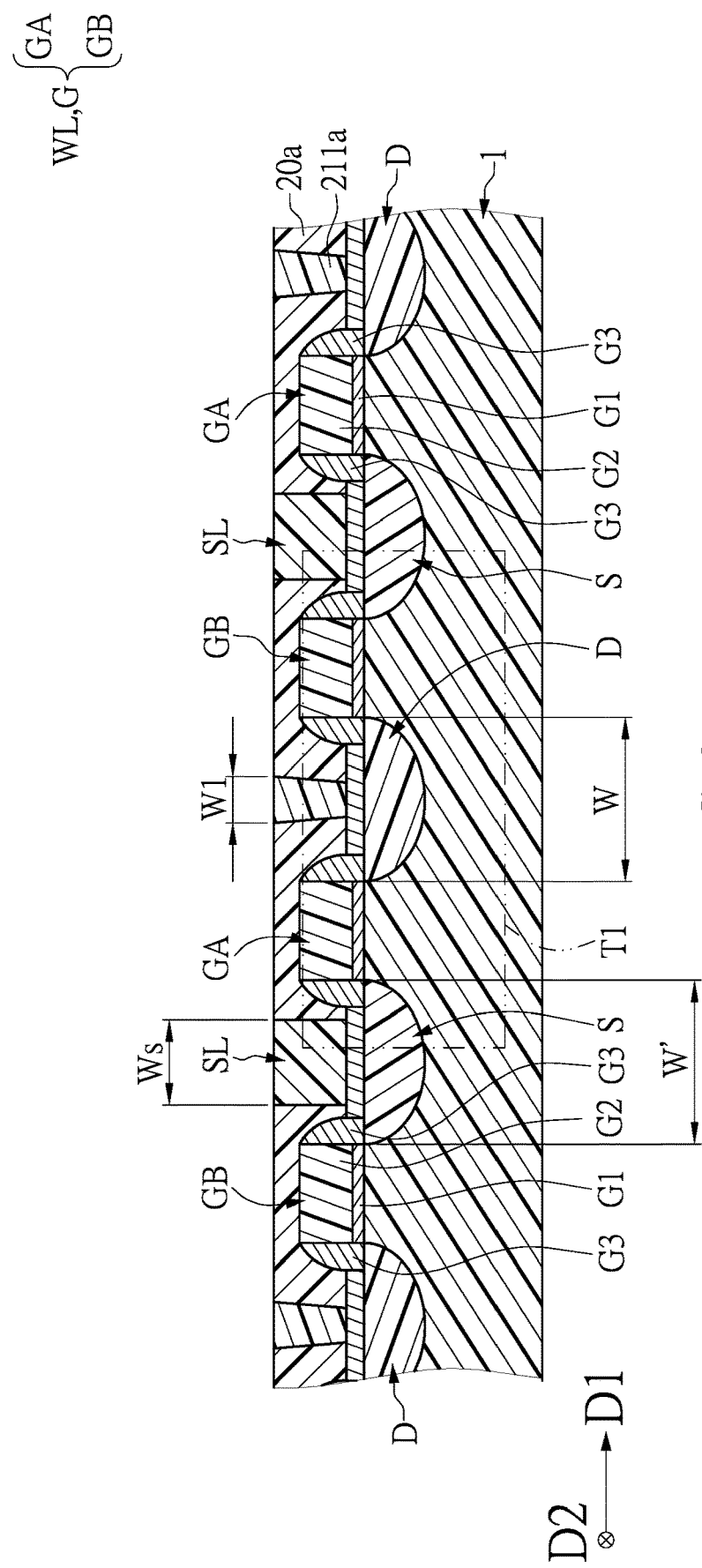
FIG. 9 is a schematic cross-sectional view taken along line IX-IX of FIG. 8.

Referring to FIG. 8 and FIG. 9, a conductive material is filled into the plurality of source grooves SH and the plurality of first contact holes h1, so as to form the plurality of source lines SL and the plurality of first contact portions 211a. As shown in FIG. 9, each of the plurality of source lines SL can come in direct contact with the source region S of a corresponding one of the transistor units T1, and a top surface of each of the plurality of source lines SL is higher than the top end of the gate structure G. Similarly, each of the plurality of first contact portions 211a can physically come in contact with the drain region D of a corresponding one of the transistor units T1, and a top end of each of the plurality of first contact portions 211a is higher than the top end of the gate structure G.

Specifically, the conductive material can be formed in the plurality of source grooves SH and the plurality of first contact holes h1, and can cover the primary flat layer 20a. Afterwards, a grinding process is performed to remove the conductive material that is on the primary flat layer 20a, while the conductive material that is in the plurality of source grooves SH and the plurality of first contact holes is reserved, so as to form the plurality of source lines SL and the plurality of first contact portions 211a. According, in the present embodiment, the top surface of each of the plurality of source lines SL (and each of the plurality of first contact portions 211a) is coplanar with the top surface of the primary flat layer 20a.

It should be noted that in the present embodiment, since the plurality of source lines SL and the plurality of first contact portions 211a are formed in the same step, each of the plurality of source lines SL and each of the plurality of first contact portions 211a are made of the same conductive material. The conductive material can be selected from a group consisting of metal, alloy, conductive oxide, conductive nitride, and any combination thereof. The metal can be, for example, but not limited to, tantalum (Ta), titanium (Ti), tungsten (W), ruthenium (Ru), aluminum (Al), and cobalt (Co). The alloy can be titanium tungsten (TiW), but the present disclosure is not limited thereto. The conductive oxide can be, for example, but not limited to, iridium dioxide (402) and ruthenium dioxide ($RuO_2$). In addition, the conductive nitride can be, for example, but not limited to, titanium nitride (TiN), tantalum nitride (TaN), and titanium aluminum nitride (TiAlN). However, in another embodiment, when the step of forming the plurality of source lines SL is performed separately from the step of forming the plurality of first contact portions 211a, a material of each of the plurality of source lines SL can be different from that of each of the plurality of first contact portions 211a.

Figure 10:
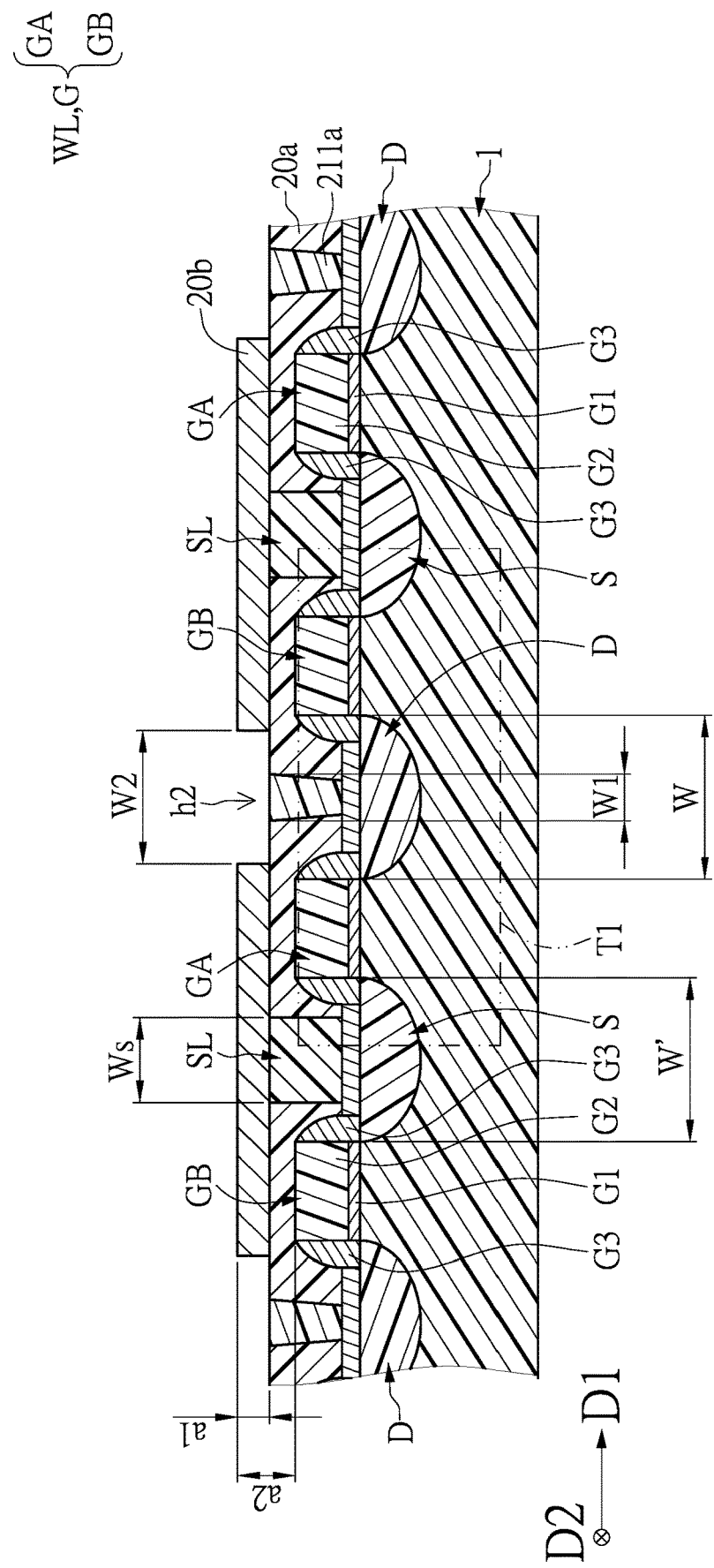
FIG. 10. is a schematic cross-sectional view of the memory device during a step of forming a plurality of second contact holes according to one embodiment of the present disclosure.

Referring to step S202 in FIG. 3, which is to be read in conjunction with FIG. 10, a cover layer 20b is formed on the primary flat layer 20a and the plurality of source lines SL. The dielectric layer 20 is formed jointly by the cover layer 20b and the primary flat layer 20a. Accordingly, the plurality of source lines SL are embedded in the dielectric layer 20. It should be noted that a material of the cover layer 20b is not necessarily the same as the material of the primary flat layer 20a.

It is worth mentioning that, since the plurality of source lines SL of the embodiments of the present disclosure are already formed in the dielectric layer 20, a quantity of the conductive pillars in the dielectric layer 20 can be reduced, and it is not necessary to reserve a space above the dielectric layer 20 for wiring of the source lines SL. Therefore, the overall size of the plurality of memory cells R1 can be reduced, and the density of the plurality of memory cells R1 can be increased.

Referring to FIG. 3, in step S203, a plurality of second contact portions are formed in the cover layer. The following example illustrates a detailed process of forming a plurality of second contact portions 211b. Referring to FIG. 10, a plurality of second contact holes h2 are formed in the cover layer 20b to expose the plurality of first contact portions 211a. In one particular embodiment, a maximum width W2 of the second contact hole h2 along the first direction D1 is less than the shortest distance W between the two gate electrodes G2 of the first gate stack portion GA and the second gate stack portion GB of the gate structure G, but the present disclosure is not limited thereto. In another embodiment, the maximum width W2 of the second contact hole h2 along the first direction D1 can be greater than or equal to the shortest distance between the two gate electrodes G2.

In the present embodiment, a depth a1 of the second contact hole h2 is less than a shortest distance a2 between an upper surface of the cover layer 20b and the gate structure G. In the embodiment as shown in FIG. 10, the second contact hole h2 extends downward from a top surface of the cover layer 20b to the top end of the first contact portion 211a, but the present disclosure is not limited thereto. In another embodiment, the second contact hole h2 extends downward from the top surface of the cover layer 20b to a position slightly lower than the top end of the first contact portion 211a.

However, a height of a bottom surface of the second contact hole h2 is not lower than the top end of the gate structure G. That is, the second contact hole h2 does not extend to a position that is lower than the top end of the gate structure G. In this way, in the subsequent step of forming the second contact portion 211b, it can be ensured that the second contact portion 211b and the gate electrode G2 are not in contact with each other but are spaced apart from each other.

Figure 11:
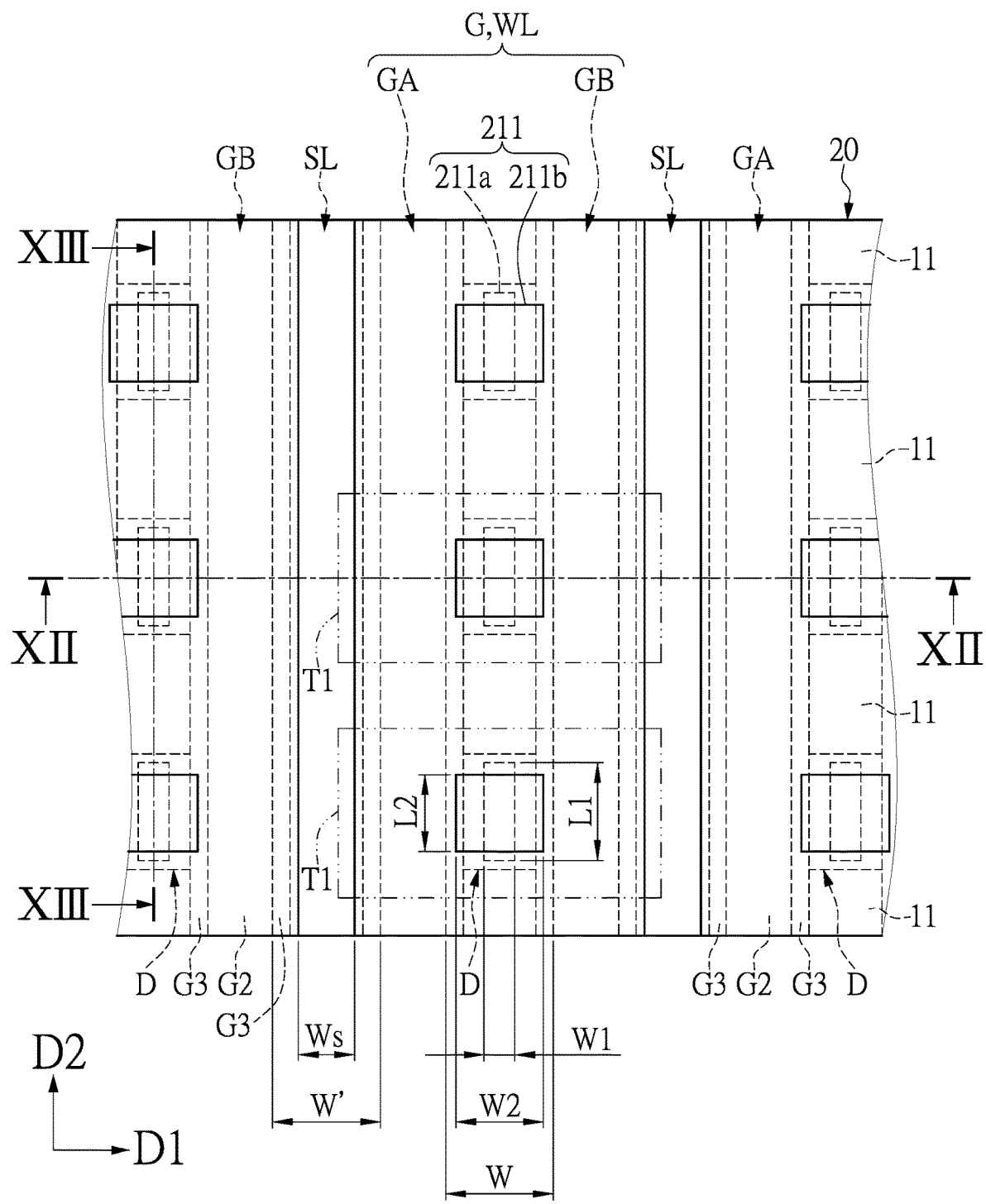
FIG. 11 is a schematic top view of the memory device during a step of forming a plurality of second contacts according to one embodiment of the present disclosure.
Figure 12:
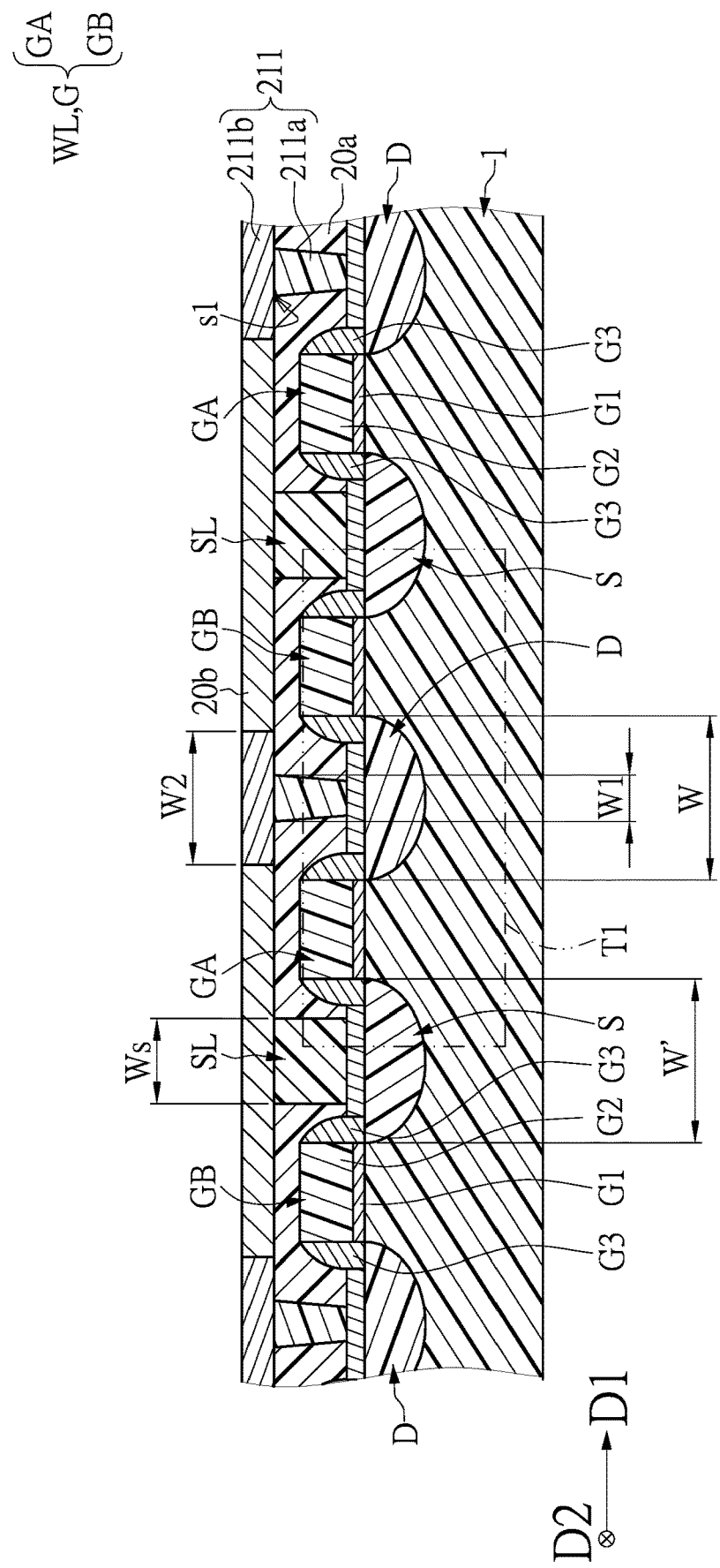
FIG. 12 is a schematic cross-sectional view taken along line XII-XII of FIG. 11.
Figure 13:
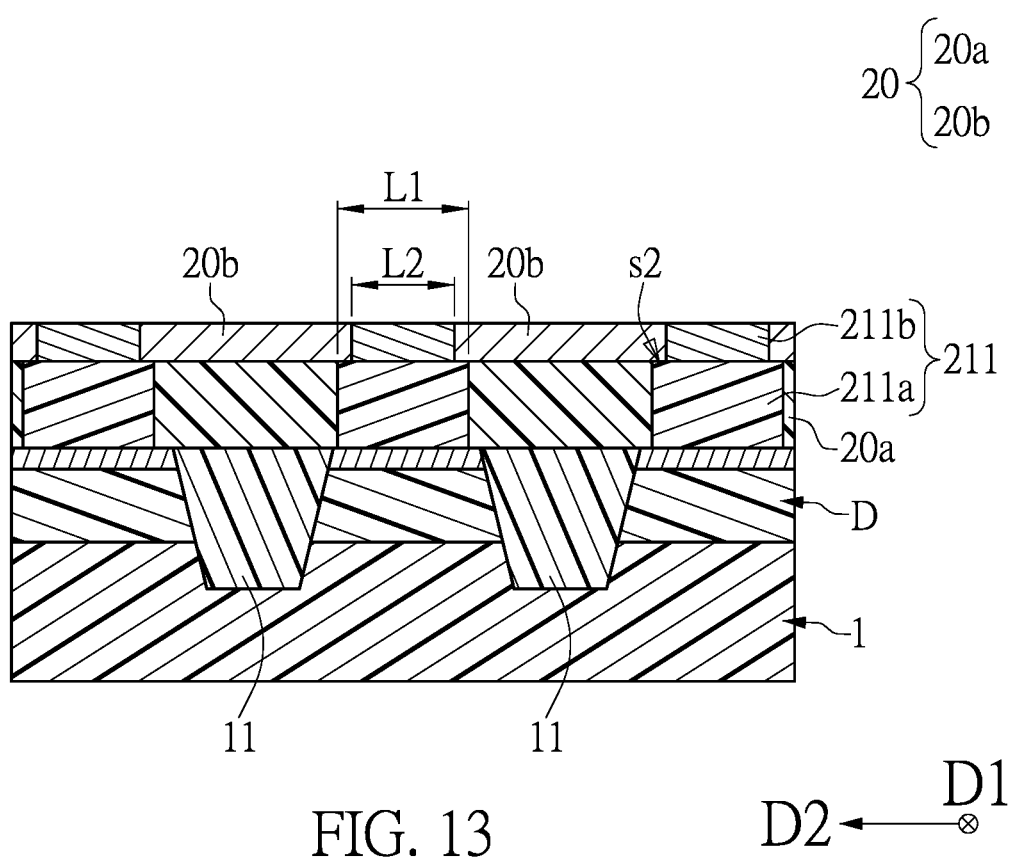
FIG. 13 is a schematic cross-sectional view taken along line XIII-XIII of FIG. 11.

Referring to FIG. 11 to FIG. 13, the conductive material is filleted into each of the plurality of second contact holes h2, so as to form the second contact portion 211b. As shown in FIG. 11, a vertical projection of the second contact portion 211b of the drain conductive pillar 211 partially (not completely) overlaps with a vertical projection of the first contact portion 211a of the drain conductive pillar 211. Further, it should be noted that, in the embodiment as shown in FIG. 11, the second contact portion 211b has a quadrilateral shape from a top view. In another embodiment, the second contact portion 211b can also have a circular shape, an elliptical shape, a geometric shape similar to a circle, or other polygonal shapes from the top view, but the present disclosure is not limited thereto.

As shown in FIG. 12, the maximum width W1 of the first contact portion 211a along the first direction D1 is less than the maximum width W2 of the second contact portion 211b along the forest direction D1. Accordingly, a part of the second contact portion 211b protrudes from one side surface of the first contact portion 211a (which faces the first gate stack portion GA or the second gate stack portion GB) along the first direction D1, so as to form a stepped structure s1. In addition, a top surface of the second contact portion 211b is flush with the upper surface of the cover layer 20b.

After the second contact portion 211b is formed, the second contact portion 211b can be separated from the gate structure G by the primary flat layer 20a, so that the second contact portion 211b does not come in physical contact with the gate electrode G2 of the gate structure G. Accordingly, through the step of forming the drain conductive pillar 211 as described above, the distance between the first gate stack portion GA and the second gate stack portion GB of the gate structure G can be further reduced, thereby reducing the size of the memory cell R1. In addition, during formation of the second contact portion 211b, under a circumstance where a process yield is met, a tolerance of position offset of the second contact portion 211b can be relaxed, thereby reducing process difficulties.

Referring to FIG. 13, in the present embodiment, a length L1 of the first contact portion 211a along the second direction D2 is greater than a length L2 of the second contact portion 211b along the second direction D2. In this way, a cross-sectional area of the first contact portion 211a along a horizontal direction can be increased, so that the drain conductive pillar 211 may have a lower resistance. Accordingly, at least one side surface of the second contact portion 211b is recessed along the second direction D2 with respect to another side surface of the first contact portion 211a (e.g., a side surface that faces an adjacent one of the first contact portions 211a), so as to form another stepped structure s2.

Figure 14:
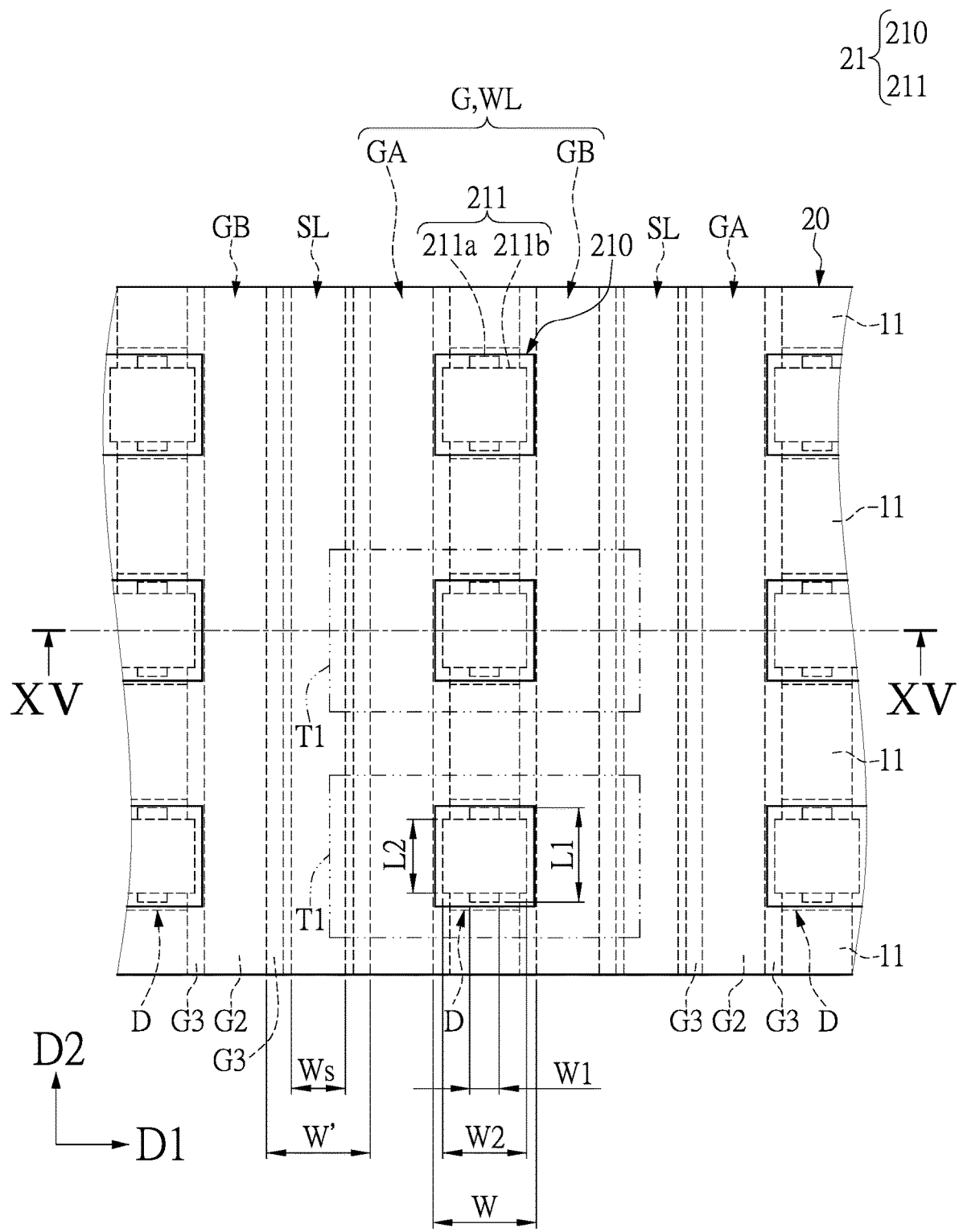
FIG. 14 is schematic top view of the memory device during a step of forming a plurality of drain conductive layers according to one embodiment of the present disclosure.
Figure 15:
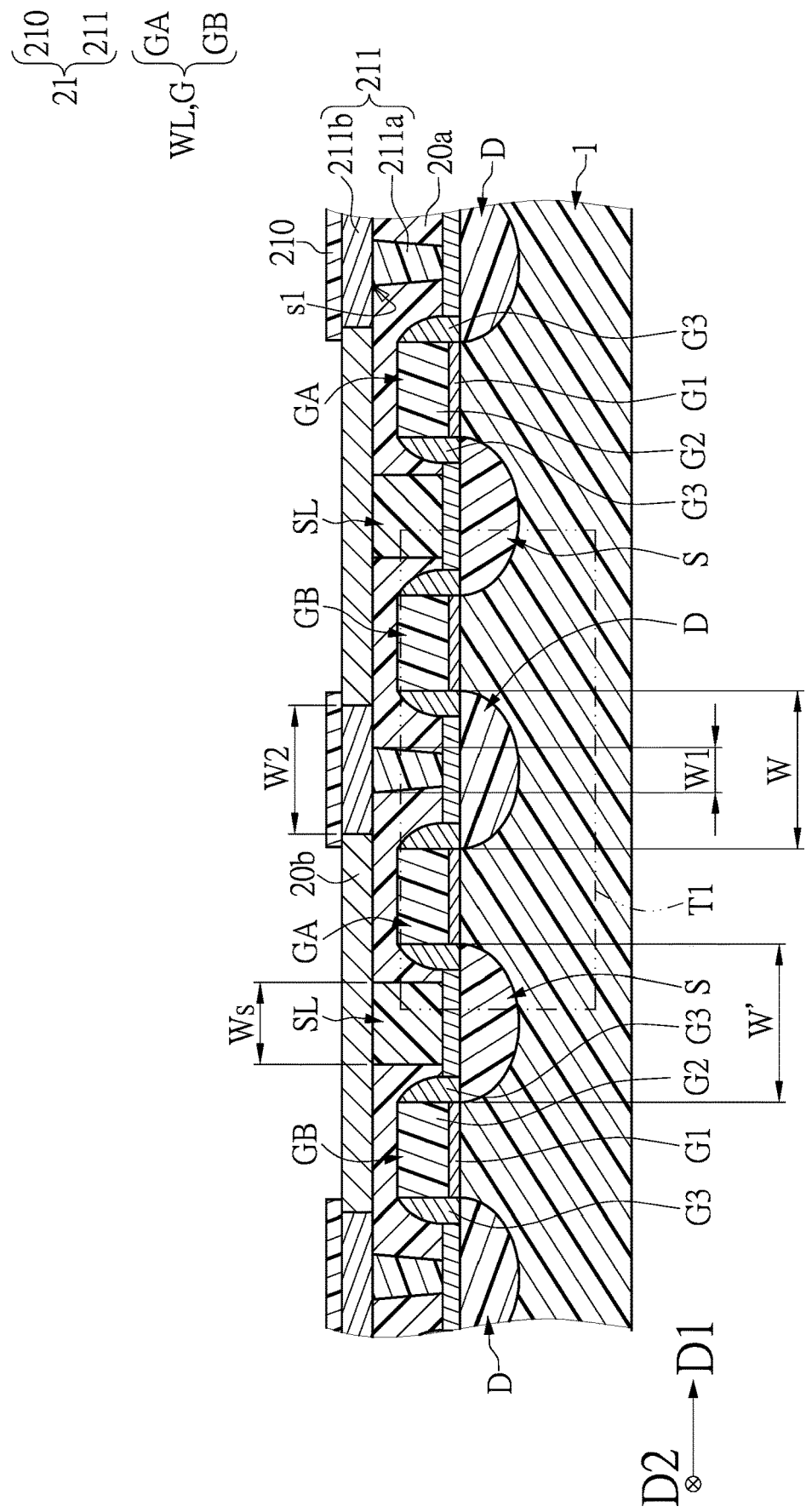
FIG. 15 is a schematic cross-sectional view taken along line XV-XV of FIG. 14.

Referring to FIG. 14 and FIG. 15, a plurality of drain conductive layers 210 are formed on the dielectric layer 20, so as to be respectively connected to the plurality of drain conductive pillars 211. Further, each of the plurality of drain conductive layers 210 covers a corresponding one of the second contacts 211b. As shown in FIG. 14, from the top view, an area of the drain conductive layer 210 is greater than an area of the second contact portion 211b, so that a contact area between the drain conductive layer 210 and the second contact portion 211b can be maximized and the contact resistance can be reduced. However, the present disclosure is not limited thereto.

A conductive pattern layer is formed jointly by the plurality of drain conductive layers 210 disposed on a top surface of the dielectric layer 20, and can be implemented in a same manufacturing process. In addition, in FIG. 15, only the drain conductive layers 210 disposed on the dielectric layer 20 and the drain conductive pillars 211 formed in the dielectric layer 20 are exemplarily illustrated. In subsequent steps, a plurality of drain conductive pillars 212 and additional drain conductive layers 210 that are connected to each other can be further formed on each of the plurality of drain conductive layers 210 (as shown in FIG. 1 and FIG. 2).

Referring to FIG. 3, the step of forming the memory cell interconnection structure and the plurality of memory units (i.e., step S2) further includes the following step.

Figure 16:
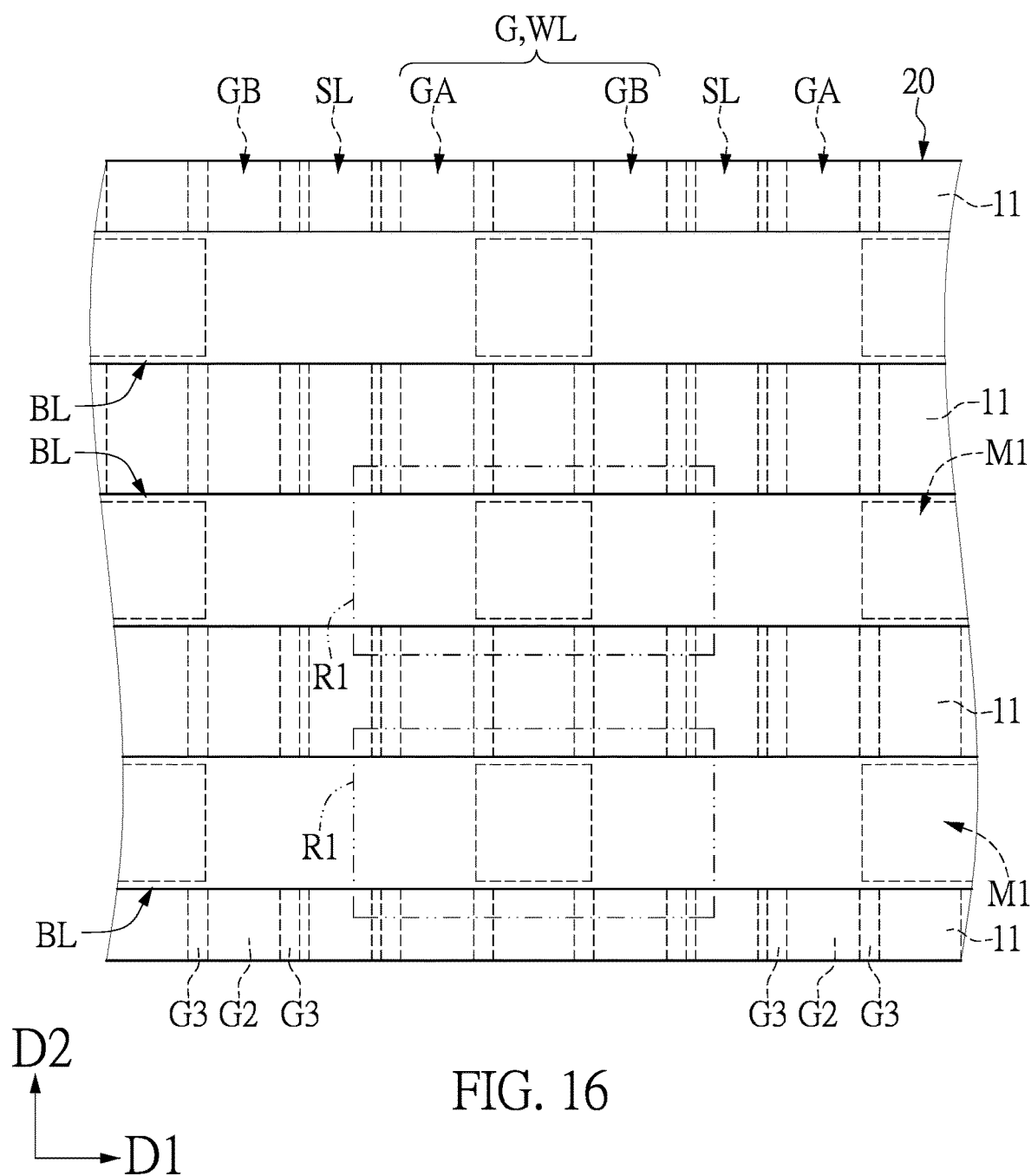
FIG. 16 is a schematic top view of the memory device during step S21 according to one embodiment of the present disclosure.

Step S21 is to form a plurality of memory units M1 and a plurality of bit lines BL. Referring to FIG. 16, after drain conductive structures 21 are formed, the plurality of memory units M1 are formed at positions that correspond to the drain conductive structures 21. Specifically, with reference to FIG. 2, a lower electrode M11 of each of the plurality of memory units M1 is electrically connected to the drain region D of a corresponding one of the plurality of transistor units T1 through the drain conductive structure 21.

Further, after the step of forming the plurality of memory units M1, the plurality of bit lines BL are formed. Each of the plurality of bit lines BL extends along the first direction D1, and is electrically connected to a corresponding one of the memory units M1. More specifically, with reference to FIG. 2, each of the plurality of bit lines BL is connected to the upper electrodes M12 of the plurality of memory units M1 of the plurality of memory cells R1 arranged along the first direction D1. As shown in FIG. 18, since the plurality of source lines SL are embedded in the dielectric layer 20 and an extension direction of the plurality of source lines SL is the same as the extension direction of the gate structure G (i.e., the word line WL), an extension direction of the plurality of bit lines BL of the present disclosure (i.e., the first direction D1) is different from the extension direction of the plurality of source lines SL (i.e., the second direction D2).

Beneficial Effects of the Embodiments

In conclusion, in the memory device and the method of manufacturing the same provided by the present disclosure, by virtue of "the drain conductive pillar 211 embedded in the dielectric layer 20 including the first contact portion 211a and the second contact portion 211b that are connected to each other, and one side surface of the first contact portion 211a being recessed along the first direction D1 with respect to one side surface of the second contact portion 211b, so as to form the stepped structure s1," the size of each of the memory cells R1 can be further reduced.

Specifically, when the first contact portion 211a of the drain conductive pillar 211 embedded in the dielectric layer 20 is configured to have a smaller width along the first direction D1, the pitch between the first gate stack portion GA and the second gate stack portion GB of the gate structure G can be further reduced, thereby reducing the size of the memory cell R1. Further, the maximum width W2 of the bottom surface of the second contact portion 211b is greater than the maximum width W1 of the first contact portion 211a along the first direction D1, so that the resistance of the drain conductive pillar 211 and the contact resistance between the drain conductive pillar 211 and the drain conductive layer 210 can be reduced.

In the embodiments of the present disclosure, by having the source lines SL embedded in the dielectric layer 20, the quantity of the conductive plugs that are disposed in the dielectric layer 20 can be significantly reduced, and no space is required to be reserved for wiring of the source lines SL. Based on the above, the overall size of the memory cells R1 can be reduced and the density of the memory cells R1 can be increased. Compared with conventional one-transistor-one-memristor (1T1M) memory components, the size of the memory cells R1 can be reduced by at least 10% through the technical means of the present disclosure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A memory device, comprising:
 a substrate;
 a memory cell array disposed on the substrate and including a plurality of memory cells, wherein each of the plurality of memory cells includes:
  a transistor unit including a drain region, a gate structure, and a source region that are arranged along a first direction; and
  a memory unit electrically connected to the transistor unit; and
 a memory cell interconnection structure disposed on the substrate and configured to establish an electrical connection between the plurality of memory cells, wherein the memory cell interconnection structure includes:
  a dielectric layer directly covering the substrate and the transistor units; and a plurality of drain conductive structures, wherein each of the plurality of drain conductive structures is electrically connected to a corresponding one of the memory units, and includes at least one drain conductive pillar, and wherein the at least one drain conductive pillar includes a first contact portion and a second contact portion that are connected to each other and embedded in the dielectric layer;
  wherein the first contact portion is physically connected to the drain region of a corresponding one of the transistor units, and one side surface of the first contact portion is recessed along the first direction with respect to one side surface of the second contact portion, so as to form one stepped structure.

2. The memory device according to claim 1, wherein the two gate structures of two adjacent ones of the transistor units are spaced apart from each other on the substrate, and are respectively disposed on opposite sides of the source region; wherein each of the gate structures includes a gate electrode and a gate insulation layer that is arranged between the gate electrode and the substrate, a shortest distance is defined between the two gate electrodes of the two adjacent gate structures, and the memory cell interconnection structure further includes:
  a plurality of source lines disposed on the substrate, wherein each of the plurality of source lines extends along a second direction and is embedded in the dielectric layer to come in direct contact with the source region of a corresponding one of the transistor units, a top surface of each of the plurality of source lines is higher than a top end of the gate structure, and a maximum width of each of the plurality of source lines along the first direction is less than the shortest distance; and
  a plurality of bit lines extending along the first direction and disposed on the dielectric layer, wherein each of the plurality of bit lines is electrically connected to a corresponding one of the memory units.

3. The memory device according to claim 1, wherein a length of the first contact portion along a second direction is greater than a length of the second contact portion along the second direction, and a top end of the first contact portion is higher than a top end of the gate structure.

4. The memory device according to claim 1, wherein each of the plurality of drain conductive structures further includes:
  a drain conductive layer connected to the drain conductive pillar, wherein the drain conductive layer is disposed on the dielectric layer and connected to the second contact portion, and an area of the drain conductive layer is greater than a cross-sectional area of the second contact along a horizontal direction.

5. The memory device according to claim 1, wherein the gate structure of the transistor unit is disposed on the substrate, and includes a first gate stack portion and a second gate stack portion that are electrically connected to each other; wherein the first gate stack portion and the second gate stack portion are spaced apart from each other along the first direction and are respectively disposed on opposite sides of the drain region, each of the first gate stack portion and the second gate stack portion includes a gate insulation layer, a gate electrode, and two spacer portions, a shortest distance is defined between the gate electrode of the first gate stack portion and the gate electrode of the second gate stack portion along the first direction, and a maximum width of the first contact portion along the first direction is less than the shortest distance.

6. The memory device according to claim 1, wherein at least one side surface of the second contact portion is recessed along a second direction with respect to another side surface of the first contact portion, so as to form another stepped structure.

7. The memory device according to claim 1, wherein the second contact portion has a bottom surface that is physically connected to the first contact portion, and the bottom surface partially overlaps with the first contact portion.

8. A method of manufacturing a memory device, comprising:
  forming a plurality of transistor units that are arranged in an array on a substrate, wherein each of the plurality of transistor units includes a drain region, a gate structure, and a source region that are arranged along a first direction, and the plurality of transistor units are arranged in a plurality of rows along a second direction; and
  forming a memory cell interconnection structure and a plurality of memory units, wherein the plurality of memory units are respectively and electrically connected to the plurality of transistor units through the memory cell interconnection structure, and the step of forming the memory cell interconnection structure at least includes:
    forming a dielectric layer and a plurality of drain conductive pillars on the substrate, wherein each of the plurality of drain conductive pillars includes a first contact portion and a second contact portion that are connected to each other and embedded in the dielectric layer;
    wherein the first contact portion is physically connected to the drain region of a corresponding one of the transistor units, and one side surface of the first contact portion is recessed along the first direction with respect to a side surface of the second contact portion, so as to form a stepped structure.

9. The method according to claim 8, wherein in the step of forming the dielectric layer and the plurality of drain conductive pillars, a plurality of source lines embedded in the dielectric layer are jointly formed, and wherein each of the plurality of source lines extends along the second direction.

10. The method according to claim 8, wherein the step of forming each of the plurality of drain conductive pillars includes:
  forming a primary flat layer to cover the plurality of transistor units;
  forming a plurality of source lines and the first contact portion of each of the plurality of drain conductive pillars in the primary flat layer;
  forming a cover layer to cover the primary flat layer, each of the plurality of source lines, and the first contact portion of each of the plurality of drain conductive pillars;
  forming a plurality of contact holes in the cover layer, wherein each of the plurality of contact holes exposes the first contact portion of a corresponding one of the plurality of drain conductive pillars, and a depth of each of the plurality of contact holes is less than a shortest distance between an upper surface of the cover layer and the gate structure; and filling each of the plurality of contact holes with a conductive material to form the second contact portions.

* * * * *